(12) United States Patent
Wakii

(10) Patent No.: US 7,078,978 B2
(45) Date of Patent: Jul. 18, 2006

(54) RING OSCILLATOR CIRCUIT

(75) Inventor: Takeshi Wakii, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 11/048,016

(22) Filed: Feb. 1, 2005

(65) Prior Publication Data

US 2005/0128011 A1    Jun. 16, 2005

Related U.S. Application Data

(63) Continuation of application No. PCT/JP04/07527, filed on Jun. 1, 2004.

(30) Foreign Application Priority Data

Jun. 11, 2003    (JP) ............................. 2003-167029

(51) Int. Cl.
 *H03B 27/00*    (2006.01)
(52) U.S. Cl. ........................................ 331/57; 331/45

(58) Field of Classification Search ................. 331/57, 331/45
See application file for complete search history.

(56) References Cited

U.S. PATENT DOCUMENTS 5,592,126 A * 1/1997 Boudewijns et al. ......... 331/45

FOREIGN PATENT DOCUMENTS

| JP | 8-316831 | 11/1996 |
|----|----------|---------|
| JP | 9-232398 | 9/1997 |
| JP | 10-74841 | 3/1998 |
| JP | 2001-85994 | 3/2001 |

* cited by examiner

*Primary Examiner*—Arnold Kinkead
(74) *Attorney, Agent, or Firm*—Cantor Colburn LLP

(57) ABSTRACT

A turn-round is provided in the middle of a plurality of differential amplifiers A1–A4. A first-stage differential amplifier A1 is provided in close proximity to a final-stage differential amplifier A4 so that distances between adjacent differential amplifiers are substantially equal to each other. With this, signal lines between the differential amplifiers are uniform in length and propagation delays are uniform. As a result, a high single-frequency oscillation signal is output.

2 Claims, 6 Drawing Sheets

A1

10

PRIOR ART

RING OSCILLATOR CIRCUIT

CROSS-REFERENCE TO RELATED APPLICATION

The present application is a continuation of PCT/JP2004/007527, filed on Jun. 1, 2004, the entire contents of which are incorporated herein by reference, and which claims the benefit of the date of the earlier filed Japanese Patent Application No. JP 2003-167029 filed on Jun. 11, 2003.

TECHNICAL FIELD

The present invention relates to a ring oscillator circuit and, more particularly, to a ring oscillator circuit provided with a plurality of inverting amplifiers.

BACKGROUND TECHNOLOGY

A ring oscillator in which a plurality of inverters are arranged in series to obtain a signal oscillating at a desired frequency and in which an output of a final stage is fed back to a first stage is known. FIG. 8 shows a structure of a ring oscillator circuit as generally known. Five inverters INV1–INV5 are arranged in series, and an output of the final-stage inverter INV5 is fed back to the input of the first-stage INV1. In this example, the oscillating operation is sustained since there are an odd number of inverters. A ring oscillator of this type is also described in, for example, a patent document No. 1.

[Patent Document No. 1]
Japanese Laid-Open Patent Application No. 2001-85994 (entire text)

DISCLOSURE OF THE INVENTION

When an apparatus has the arrangement as shown in FIG. 8 or the patent document No. 1, the feedback path from the last-stage inverter to the first-stage inverter is relatively long. As the oscillation frequency is increased, the length of this path affects the oscillation signal by introducing jitter or other distortion components. As a result, the apparatus may fail to output a signal at a desired frequency, or higher harmonics become more noticeable, producing radiated emission.

The present invention has been done in view of the aforementioned circumstances and its object is to provide a ring oscillator circuit capable of generating a stable, high single-frequency oscillation signal.

One mode of practicing the present invention is a ring oscillator circuit, wherein a plurality of inverting amplifiers are provided at substantially equal distances from each other in a ring route. More specifically, a first stage and a final stage of the plurality of inverting amplifiers are provided in close proximity to each other, by providing a turn-round in a ring route in the middle of the plurality of inverting amplifiers, thereby ensuring that the distances between adjacent inverting amplifiers are substantially equal to each other.

Since the distances between the inverting amplifiers are substantially equal to each other, breaking of symmetry such as a relatively long return route from a final stage to a first stage does not occur. Accordingly, signal propagation delays between adjacent inverting amplifiers are uniform so that waveform distortion is reduced. Further, proximity of the final stage to the first stage provides an advantage in that variation in product characteristics is prevented, which additionally reduces waveform distortion.

The inverting amplifiers may be ordinary inverters. Alternatively, multiple-input logic elements such as NAND and NOR may be used. The inverting amplifiers may be differential amplifiers. Differential amplifiers are advantageous in that waveform distortion in an oscillation signal is reduced in general. The phrase "substantially uniform" refers to the level of uniformity permitted by the possible layout of circuit elements. The gain of the amplifiers may be any desired value including 1.

A layout of inverting amplifiers in an outgoing route in the ring route may be reversed with respect to a layout in a homeward route. In this case, the plurality of inverting amplifiers are arranged symmetrical with respect to the center of the ring, which contributes to the uniformity of signal propagation characteristic between the inverting amplifiers.

The ring oscillation circuit may further comprise a control circuit generating a drive signal to drive the plurality of inverting amplifiers. In this case, signal lines from the control circuit to the plurality of inverting amplifiers may be arranged substantially symmetrically with respect to the outgoing route and the homeward route. This layout is also useful in ensuring that signal propagation characteristic is uniform. The control circuit may be provided between the outgoing route and the homeward route. In this case, it is easy to ensure that the distances from the control circuit to the inverting amplifiers are equal to each other so that the length of control signal lines is uniform from stage to stage. Therefore, this arrangement is also useful in reducing signal distortion.

BEST MODE FOR CARRYING OUT THE INVENTION

Figure 1:
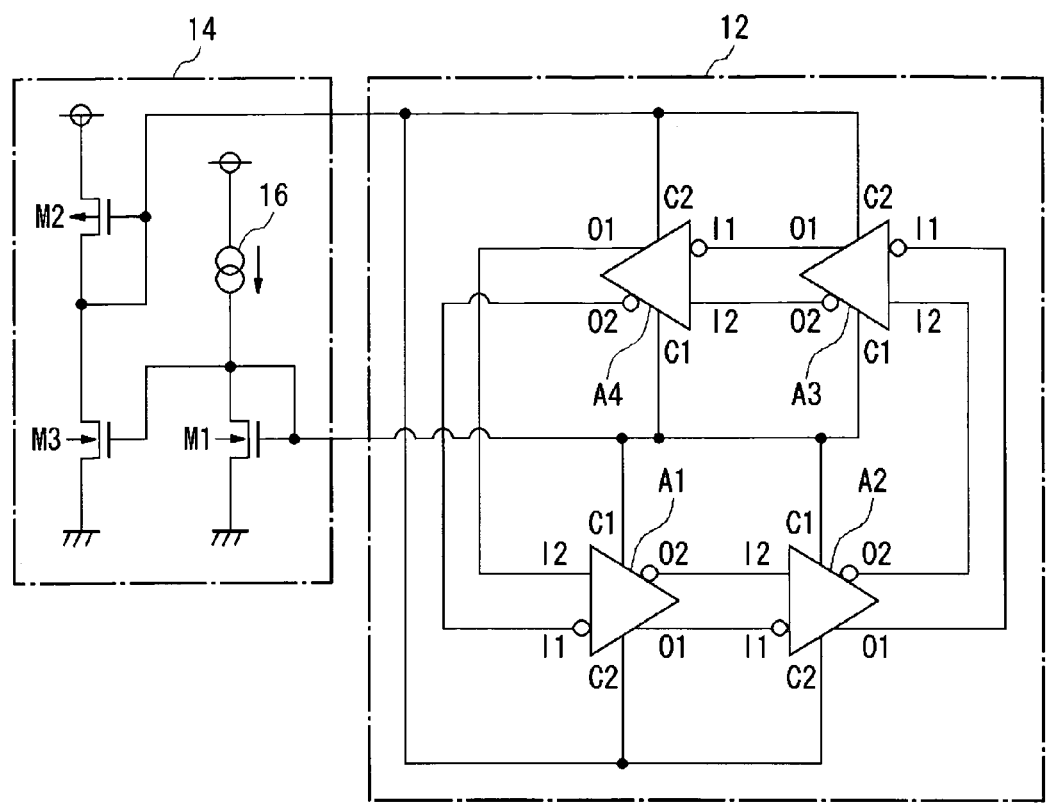
FIG. 1 shows a ring oscillation circuit according to an embodiment.

FIG. 1 shows a ring oscillator circuit 10 according to the embodiment. Referring to FIG. 1, an oscillation unit 12 is provided with four differential amplifiers A1–A4 and oscillates at a predetermined frequency. A control circuit 14 drives the oscillation unit 12 by supplying a drive signal thereto so as to adjust the oscillation frequency of the oscillation unit 12 at a desired value.

The differential amplifiers A1–A4 of the oscillation unit 12 are of the same structure. Each of the amplifiers is provided with first and second input terminals I1 and I2, first and second output terminals O1 and O2, and first and second control signal terminals C1 and C2. Each of the amplifiers also has terminals for a power supply VDD and the ground GND. The four differential amplifiers A1–A4 are arranged in the configuration of a ring. The first and second outputs O1 and O2 of each of the amplifiers are connected to the first and second inputs I1 and I2 of the next differential amplifiers. In order to sustain oscillation with the four-amplifier configuration, signal lines are twisted between the final-stage differential amplifier A4 and the first-stage differential amplifier A1. That is, the first and second outputs O1 and O2 of the final-stage differential amplifier A4 are connected to the second and first inputs I2 and I1, respectively, of the first-stage differential amplifier A1. The actual layout of the four differential amplifiers A1–A4 will be described in detail by referring to FIG. 3 and subsequent drawings.

The control circuit 14 is provided with a constant-current source 16 and a first transistor M1, an n-channel MOSFET, connected in the stated order between a power supply and the ground. The gate of the first transistor M1 is connected to the output of the constant-current source 16. Therefore, the gate voltage of the first transistor M1 is determined by a current that flows in the constant-current source 16. The gate voltage is used as a first control signal C1. The control circuit 14 is further provided with a second transistor, a p-channel MOSFET, and a third transistor M3, an n-channel MOSFET, connected in the stated order between a power supply and the ground. The gate of the third transistor M3 is connected to the gate of the first transistor M1 so that the conduction characteristic of the on-state of the third transistor M3 is determined accordingly. The gate of the second transistor M2 is connected to the drain thereof and is also connected to the drain of the third transistor M3. Accordingly, the conduction characteristic of the on-state of the third transistor M3 determines the conduction characteristic of the on-state of the second transistor M2 and the gate voltage of the second transistor M2. The gate of the second transistor M2 is used as a second control signal C2. With the structure described above, the oscillation frequency of the oscillation unit 12 is determined by adjusting the current level of the constant-current source 16 in the control circuit 14 and the sizes etc. of the three transistors M1, M2 and M3.

Figure 2:
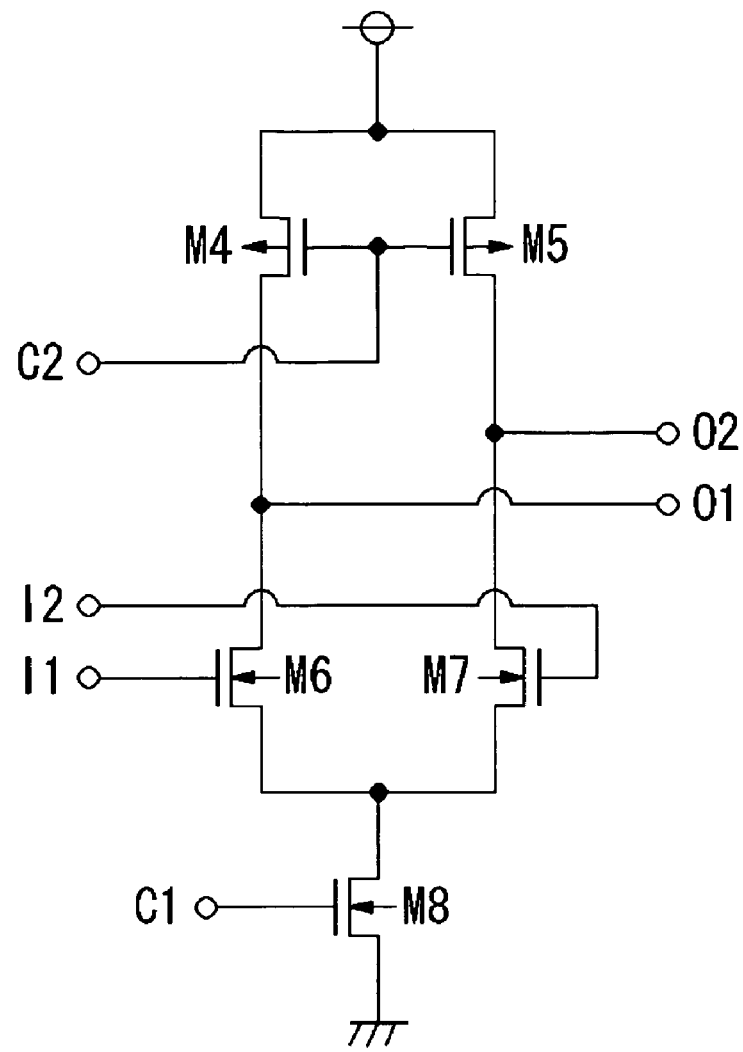
FIG. 2 shows a detailed structure of a differential amplifier of FIG. 1.

FIG. 2 shows a detailed structure of the differential amplifier of FIG. 1. Since the four differential amplifiers A1–A4 are identical, the first-stage differential amplifier A1 will be described as a representative example. The circuit itself is known. Between a power supply and the ground are provided: a route comprising a fourth transistor M4, a p-channel MOSFET, and a sixth transistor M6, an n-channel MOSFET; and a route comprising a fifth transistor M5, a p-channel MOSFET, and a seventh transistor M7, an n-channel MOSFET. The overall current is defined by an eighth transistor M8, an n-channel MOSFET. The first and second inputs I1 and I2 correspond to the gates of the sixth transistor M6 and the seventh transistor M7, respectively. The first and second outputs O1 and O2 derive from the drains of the fourth transistor M4 and the sixth transistor M6, and the drains of the fifth transistor M5 and the seventh transistor M7, respectively. The first and second control signals C1 and C2 are supplied to the gate of the eighth transistor M8, and the common gate of the fourth transistor M4 and the fifth transistor M5, respectively.

Figure 3:
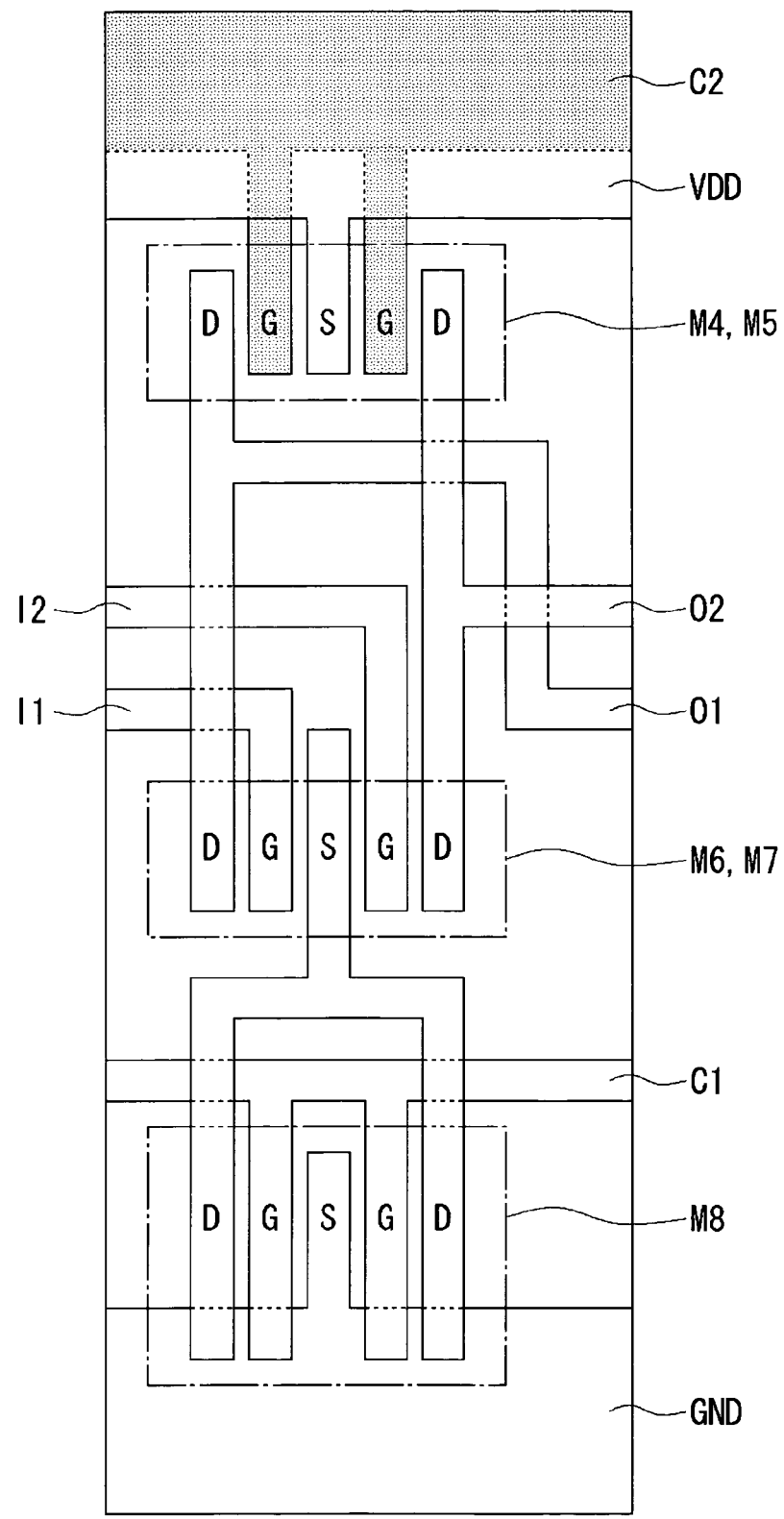
FIG. 3 shows a specific interconnect layout of the differential amplifier of FIG. 1.

FIG. 3 shows a specific interconnect layout of the differential amplifier A1. The figure gives only a schematic view for ease of understanding. The patterns of overlapping of different layers and the width of patterns are not exactly as illustrated. Referring to the figure, the following patterns are formed starting at the top of the figure:
1) pattern for the power supply VDD
2) pattern for the second control signal C2 in a layer separate from the layer for 1) and partly overlapping the pattern for the power supply VDD (the stipple pattern in the figure)
3) the fourth transistor M4 and the fifth transistor M5
4) patterns for the second and first inputs I2 and I1, and patterns for the second and first outputs O2 and O1
5) pattern for the first control signal C1
6) the eighth transistor M8
7) pattern for the ground GND The sources of the fourth transistor M4 and the fifth transistor M5 are connected to the power supply VDD and the second control signal C2 is supplied to the gates thereof. The drains of the fourth transistor M4 and the fifth transistor M5 constitute the first and second outputs O1 and O2, respectively, and are connected to the drains of the sixth transistor M6 and the seventh transistor M7, respectively. The sixth transistor M6 and the seventh transistor M7 share the source, and the first and second inputs I1 and I2 are supplied to the gates of the sixth transistor M6 and the seventh transistor M7, respectively. The common source of the sixth transistor M6 and the seventh transistor M7 is connected to the drain of the eighth transistor M8. The source of the eighth transistor M8 is grounded, and the first control signal C1 is supplied to the gate thereof.

In the structure described above, the first and second inputs I2 and I1 are horizontally aligned with the first and second outputs O1 and O2, respectively. Accordingly, in an arrangement of differential amplifiers, delivery of the output of a differential amplifier of a given stage to a differential amplifier of a subsequent stage can take place simply by forming a horizontally straight pattern. Similarly, the power supply pattern, and the first and second control signals C1 and C2 are also formed as horizontally straight patterns. Therefore, simply by extending these patterns horizontally, connection of signal line patterns from a given stage to the corresponding patterns in a subsequent stage takes place naturally. However, the invention is not focused on horizontal formation of patterns. Any connection suffices as long as connection of a given stage with a subsequent stage is facilitated to a degree.

Figure 4:
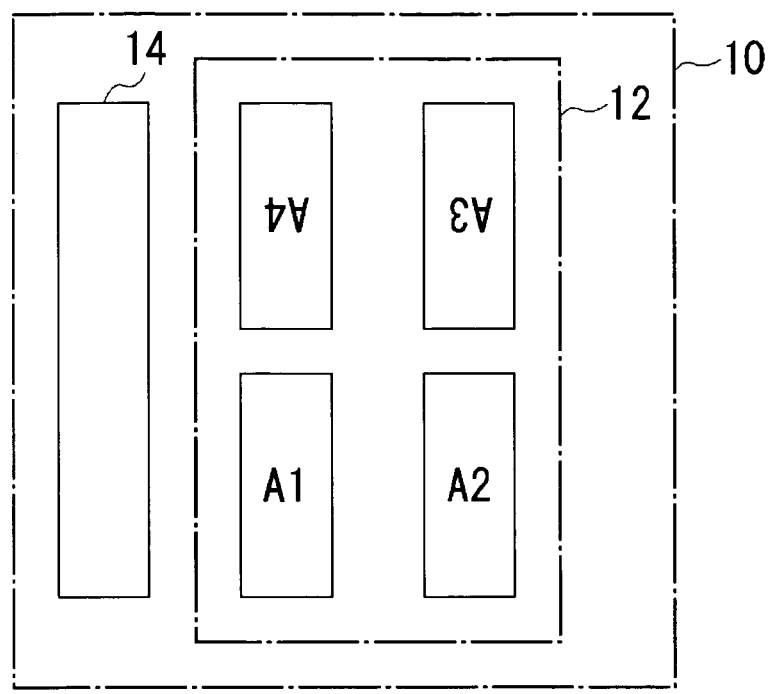
FIG. 4 shows a specific layout of the ring oscillator circuit of FIG. 1 using the layout of FIG. 3.

FIG. 4 shows a specific layout of the ring oscillator circuit 10 of FIG. 1 using the differential amplifier of FIG. 3. As shown in FIG. 4, the oscillation unit 12 and the control circuit 14 are arranged side by side. The following rules are observed in arranging the four differential amplifiers A1–A4 in the oscillation unit 12.

1. The ring starts with the first-stage differential amplifier A1, reaches the final-stage differential amplifier A4 via the two differential amplifiers A2 and A3, and returns to the first-stage differential amplifier A1.

2. The first-stage differential amplifier A1 and the subsequent differential amplifier A2 provided in the outgoing route are oriented in the layout shown in FIG. 3. The third-stage differential amplifier A3 and the final-stage differential amplifier A4 provided in the homeward route are arranged in a layout 180° rotated with respect to the orientation shown in FIG. 3. In the illustration, the rotated layout is indicated by symbols upside down.

3. It is ensured that the adjacent differential amplifiers are substantially equidistant from each other, and the pattern length of the first and second input signals I1 and I2 for delivery of outputs between differential amplifiers is substantially uniform between stages.

4. The oscillation unit 12 as a whole is made as compact as possible.

Rule 3 prevents jitter from being generated at a high frequency, ensuring that a single-frequency high-quality output waveform is produced. Radiated emission is reduced due to reduction in waveform distortion. Rule 2 not only contributes to the implementation of rule 3 but also simplifies or facilitates the formation of signal line patterns from the control circuit 14 to the oscillation unit 12. Referring to FIG. 4, signal line patterns from the control circuit 14 to the oscillation unit 12 may be symmetrical with respect to a hypothetical line between the first first-stage differential amplifier A1 and the final-stage differential amplifier A4 and a hypothetical line between the second-stage differential amplifier A2 and the third-stage differential amplifier A3. This is advantageous in that the fourth differential amplifiers A1–A4 are driven uniformly. Rule 4 not only provides advantage in terms of mounting efficiency but also prevents variation in the characteristic of products fabricated since the four differential amplifiers A1–A4 produced are physically quite close to each other. Further, as the length of signal lines carrying high frequencies is reduced, radiated emission is reduced.

The ring oscillator circuit 10 that uses differential amplifiers has been described in the embodiment. Alternatively, the ring oscillator circuit 10 may be formed using ordinary inverters of a single-input, single-output type or other arbitrary inverting circuits. Such a consideration is valid throughout the specification.

While the embodiment uses four differential amplifiers, any desired number of amplifiers may of course be used. When there are an even number 2n of differential amplifiers, a turn-round point in a ring route may be set such that a route covering the first through nth differential amplifiers is an outgoing route and a route covering the (n+1)th through 2nth differential amplifiers is a homeward route. The turn-round is not necessarily provided at a midpoint. The essential requirement is that the length of patterns for carrying the oscillation signal between adjacent differential amplifiers is as uniform as possible from stage to stage. Terms like "outgoing route", "homeward route" and "turn-round point" are used only in this context. A consideration to be given when there are an odd number of differential amplifiers will be described referring to FIG. 6 and the subsequent figure.

Figure 5:
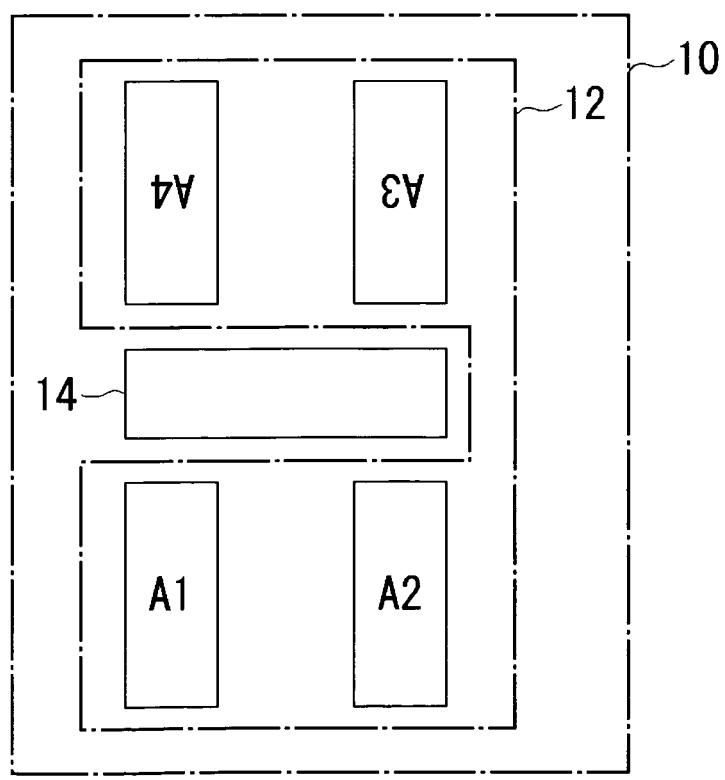
FIG. 5 shows a specific layout of a ring oscillator circuit according to another embodiment.

FIG. 5 shows a specific layout of a ring oscillator circuit 10 according to another embodiment. A difference from the layout of FIG. 4 is that the control circuit 14 is located in the middle of the oscillation circuit 12. More specifically, the control circuit 14 is placed on the boundary between the outgoing route and the homeward route so as to partition the ring route into equal halves. According to this embodiment, the control circuit 14 is placed at equal distances from the four differential amplifiers A1–A4 so that the control circuit 14 is capable of driving them uniformly. With this, waveform distortion is reduced.

Figure 6:
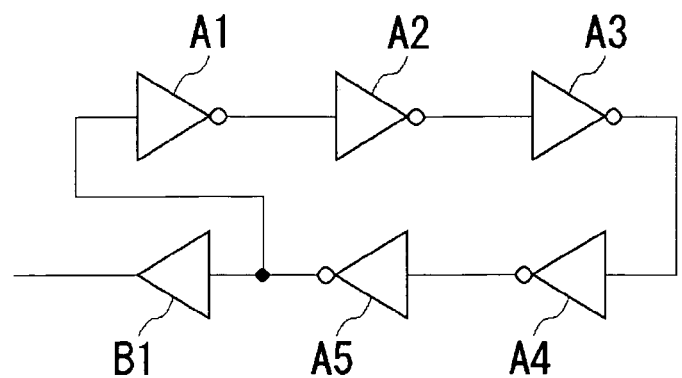
FIG. 6 shows a ring oscillator circuit according to another embodiment.

FIG. 6 shows a ring oscillator circuit 10 in which there are an odd number of differential amplifiers. Five inverters A1–A5 as amplifiers are connected in the stated order. The output of the final-stage inverter A5 is fed back to the first-stage inverter A1. An oscillation signal is obtained in the form of the output from the final-stage inverter A5 via a buffer B1.

Figure 7:
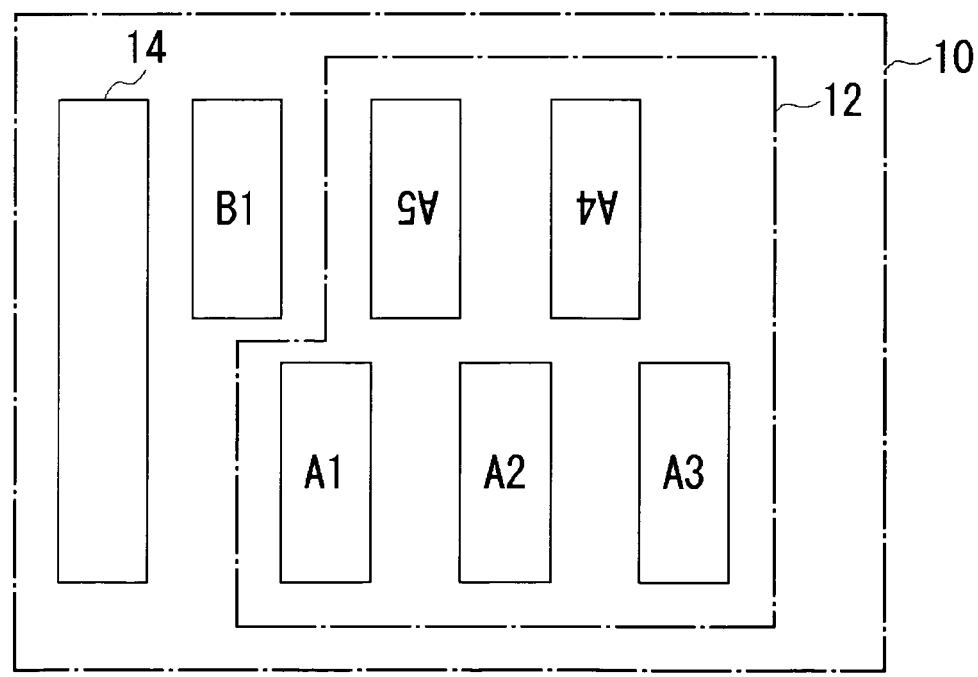
FIG. 7 shows a specific layout of the ring oscillator circuit of FIG. 6.
Figure 8:
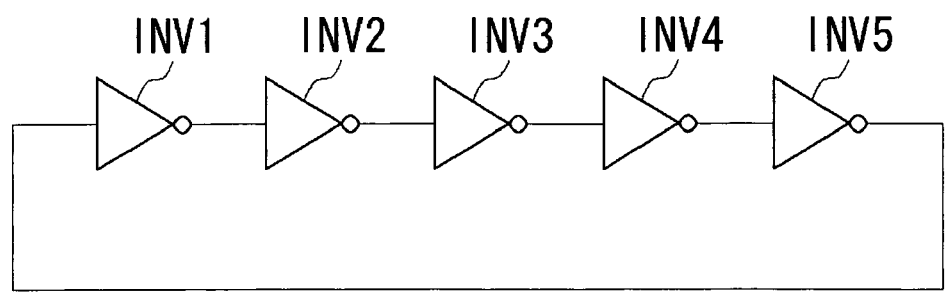
FIG. 8 shows a structure of a ring oscillator circuit generally used according to the related art.

FIG. 7 shows a specific layout of the ring oscillator circuit 10 of FIG. 6. The ring oscillator circuit 10 is provided with the oscillation unit 12, the control unit 14 and the buffer B1. In the oscillation unit 12, five inverters A1–A5 are arranged in the shape of an inverted letter W. Other layouts are possible as long as the length of patterns for carrying the oscillation signal between adjacent inverters is substantially uniform from stage to stage.

Described above is an explanation of the present invention based on the embodiments. The description of the embodiments is illustrative in nature and it will be obvious to those skilled in the art that variations are possible within the scope of the present invention.

INDUSTRIAL USABILITY

According to the present invention, there is provided a ring oscillator circuit in which waveform distortion is reduced.

The invention claimed is:

1. A ring oscillator circuit comprising:
a plurality of inverting amplifiers; and
a control circuit generating a drive signal to drive the plurality of inverting amplifiers; wherein
a first stage and a final stage of the plurality of inverting amplifiers are provided in close proximity to each other, by providing a turn-round in a ring route in the middle of the plurality of inverting amplifiers, thereby ensuring that the distances between adjacent inverting amplifiers are substantially equal to each other, wherein a layout of inverting amplifiers in an outgoing route in the ring route is reversed with respect to a layout in a homeward route, and signal lines from the control circuit to the plurality of inverting amplifiers are arranged substantially symmetrically with respect to the outgoing route and the homeward route.

2. A ring oscillator circuit comprising:
a plurality of inverting amplifiers; and
a control circuit generating a drive signal to drive the plurality of inverting amplifiers; wherein
a first stage and a final stage of the plurality of inverting amplifiers are provided in close proximity to each other, by providing a turn-round in a ring route in the middle of the plurality of inverting amplifiers, thereby ensuring that the distances between adjacent inverting amplifiers are substantially equal to each other, wherein a layout of inverting amplifiers in an outgoing route in the ring route is reversed with respect to a layout in a homeward route, and the control circuit is provided between the outgoing route and the homeward route.

* * * * *